(12) United States Patent
Proesel et al.

(10) Patent No.: US 8,593,226 B2
(45) Date of Patent: Nov. 26, 2013

(54) TRANSIMPEDANCE AMPLIFIER

(75) Inventors: Jonathan E. Proesel, Yorktown Heights, NY (US); Alexander V. Rylyakov, Mount Kisco, NY (US); Clint L. Schow, Ossining, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 13/226,650

(22) Filed: Sep. 7, 2011

(65) Prior Publication Data

US 2013/0057348 A1 Mar. 7, 2013

(51) Int. Cl.
*H03F 3/08* (2006.01)

(52) U.S. Cl.
USPC .......................................... 330/308; 330/260

(58) Field of Classification Search
USPC ........ 330/59, 110, 308, 260, 291; 250/214 A, 250/214 AG
See application file for complete search history.

(56) References Cited

U.S. PATENT DOCUMENTS

| 4,415,803 A | 11/1983 | Muoi | |
|---|---|---|---|
| 4,902,982 A * | 2/1990 | Moore et al. | 330/308 |
| 7,525,391 B2 * | 4/2009 | Denoyer | 330/308 |
| 2004/0036536 A1 * | 2/2004 | Gupta | 330/308 |
| 2008/0007343 A1 * | 1/2008 | Natzke | 330/308 |
| 2009/0108942 A1 | 4/2009 | Liu et al. | |

FOREIGN PATENT DOCUMENTS

| EP | 1881600 A2 | 1/2008 |
|---|---|---|
| EP | 2302787 A1 | 3/2011 |
| JP | 2000315923 A | 11/2000 |

OTHER PUBLICATIONS

Frankie Liu et al., "10 Gbps, 530 fJ/b Optical Transceiver Circuits in 40 nm CMOS," 2011 Symposium on VLSI Circuits Digest of Technical Papers, Jun. 15-17, 2011, pp. 290-291.
Mark Engels et al., "A 1-Gb/s, 0.7-um CMOS Optical Receiver with Full Rail-to-Rail Output Swing," IEEE Journal of Solid-State Circuits, vol. 34, No. 7, Jul. 1999, pp. 971-977.
Deutsches Patent-und Markenamt, DE Office Action; 10 2012 213730.0, Nov. 15, 2012, pp. 1-8.

* cited by examiner

*Primary Examiner* — Khanh V Nguyen
(74) *Attorney, Agent, or Firm* — Cantor Colburn LLP; Vazken Alexanian

(57) ABSTRACT

A circuit includes a transimpedance amplifier portion having a first input node and a second input node, and a feedback circuit portion comprising a first transistor having a drain terminal connected to the first input node, a source terminal, and a gate terminal, a second transistor having a drain terminal connected to the second input node, a source terminal, and a gate terminal, and a third transistor having a drain terminal connected to the source terminal of the first transistor and the source terminal of the second terminal.

23 Claims, 7 Drawing Sheets

US 8,593,226 B2

TRANSIMPEDANCE AMPLIFIER

FIELD OF INVENTION

The present invention relates generally to transimpedance amplifiers.

DESCRIPTION OF RELATED ART

Transimpedance amplifiers (TIAs) are often used to convert an input current signal and into a corresponding output voltage signal. Typical TIAs are often used in systems that receive a current signal from a sensor device. The output current signal from the sensor device is received by the TIA and converted into a corresponding voltage signal that may be processed by a processor. For example, optical receivers often include a photodiode device that outputs a current signal in response to being exposed to a source of radiation such as light. The TIA receives the current signal output from the photodiode, converts the current signal into a corresponding voltage signal, and outputs the voltage signal. The voltage signal may be amplified by an amplifier, such as a linear amplifier that outputs the amplified voltage signal to a clock and data recovery block. The clock and data recovery block converts the amplified voltage into a digital data signal and recovers an associated clock signal from the data rate of the digital data. The data signal and the clock signal may be output to a processor device or logic circuit.

BRIEF SUMMARY

According to one embodiment of the present invention a circuit includes a transimpedance amplifier portion having a first input node and a second input node, and a feedback circuit portion comprising a first transistor having a drain terminal connected to the first input node, a source terminal, and a gate terminal, a second transistor having a drain terminal connected to the second input node, a source terminal, and a gate terminal, and a third transistor having a drain terminal connected to the source terminal of the first transistor and the source terminal of the second terminal.

According to another embodiment of the present invention a circuit includes a transimpedance amplifier portion having an input node and an output node, and a feedback circuit portion comprising a first transistor having a drain terminal connected to the input node, a source terminal, and a gate terminal connected to the output node, and a second transistor having a drain terminal connected to the first input node, a source terminal, and a gate terminal connected to the output node.

According to yet another embodiment of the present invention a system includes a transimpedance amplifier portion having a first input node, a second input node, a first output node, and a second output node, a feedback circuit portion comprising a first transistor having a drain terminal connected to the first input node, a source terminal, and a gate terminal, a second transistor having a drain terminal connected to the second input node, a source terminal, and a gate terminal, and a third transistor having a drain terminal connected to the source terminal of the first transistor and the source terminal of the second terminal, and an amplifier portion having a first input node connected to the first output node of the transimpedance amplifier portion, a second input node connected to the second output node of the transimpedance amplifier portion, and an output node.

According to yet another embodiment of the present invention a system includes a transimpedance amplifier portion having an input node and an output node, a feedback circuit portion comprising a first transistor having a drain terminal connected to the input node, a source terminal, and a gate terminal connected to the output node, and a second transistor having a drain terminal connected to the first input node, a source terminal, and a gate terminal connected to the output node, and an amplifier portion having a first input node connected to the first output node of the transimpedance amplifier portion, a second input node connected to the second output node of the transimpedance amplifier portion, and an output node.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

To reliably convert an input current into a digital output, the average, or DC input current is determined and used as a threshold to differentiate input currents below the average (digital 0s) from input currents above the average (digital 1s). Removing the DC input current is known as level restoration, as it restores the DC level to zero to provide the threshold. Any DC input offset voltage that exists in a transimpedance amplifier (TIA) or amplifier such as, for example, a limiting amplifier, should also be compensated since the input offset voltage effectively shifts the threshold between 0 and 1. A preferred threshold has the greatest possible distance between the 0 and 1 levels, which allows the greatest space for signal noise or other non-idealities to corrupt the signal without resulting in errors in the received data. The space between the threshold and the 0 and 1 levels is called the noise margin. If the threshold is not optimally set, the noise margin may be degraded and the probability of an error increases (i.e. the bit error rate (BER) increases).

A feedback loop is often used to provide level restoration and DC offset compensation in a circuit with a TIA and limiting amplifier (LA). In this regard, the feedback loop measures the DC level at the output of the LA and returns a proportional signal to the input of the TIA, which forces the output DC level to either a reference voltage (for a single ended output) or to a differential zero (for a differential output). The output DC level is forced to an ideal threshold, thereby level restoring the input DC current and compensating for the TIA and LA DC input offsets, maximizing the noise margin, and minimizing the BER.

Figure 1:
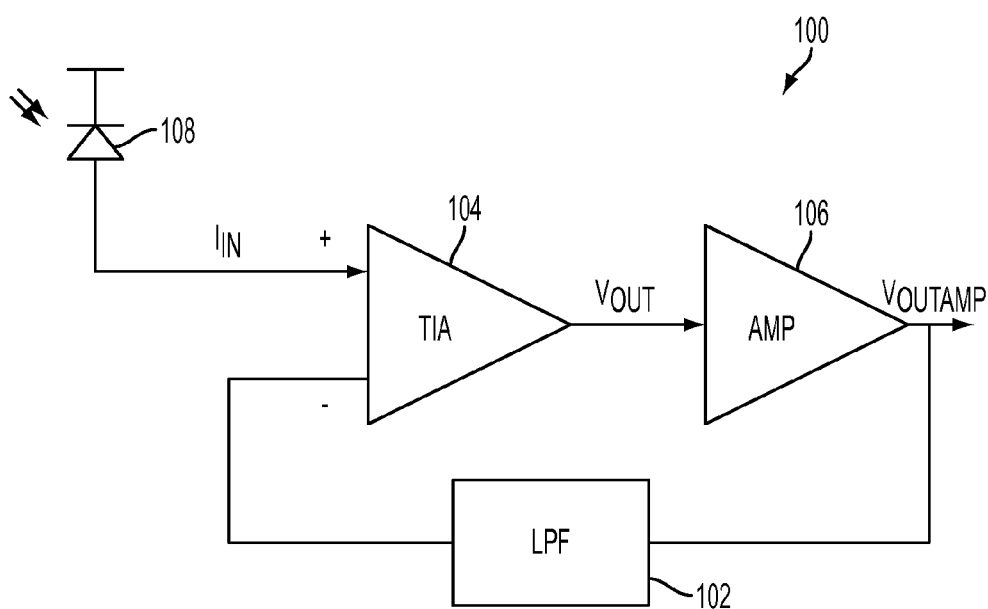
FIG. 1 illustrates a prior art example of a circuit.

FIG. 1 illustrates a prior art example of a circuit 100 with a TIA 104 and LA 106 circuit with a low pass filter (LPF) arrangement 102. The feedback loop may be implemented using low pass filter 102 such as, for example, a resistor capacitor (RC). The LPF 102 extracts the DC content of the output and returns the DC content to the TIA 104 to be subtracted from the input DC level and the TIA and LA DC offset. The TIA 104 has two inputs, with one input connected to the input device 108 and the second input connected to the feedback loop. The subtraction of the DC content occurs within the TIA 104.

In prior art examples of complementary metal oxide semiconductor (CMOS) TIA circuits, an additional NMOS transistor (not shown) may be used to subtract the DC input current and any DC offset in the TIA. When such a circuit is used in an analog feedback system, the circuit performs poorly because the feedback loop gain depends on the bias point of the NMOS transistor. The varying feedback loop gain causes the frequency response of the feedback loop to change as the DC input current and the TIA and LA offsets vary, which negatively affects the circuit performance in an analog feedback system. The circuit arrangement may only subtract current from the input node, thus providing level restoration only when the input DC current is positive (flowing into the input node). When the DC current is negative (flowing out of the input node) the circuit cannot provide level restoration.

Figure 2:
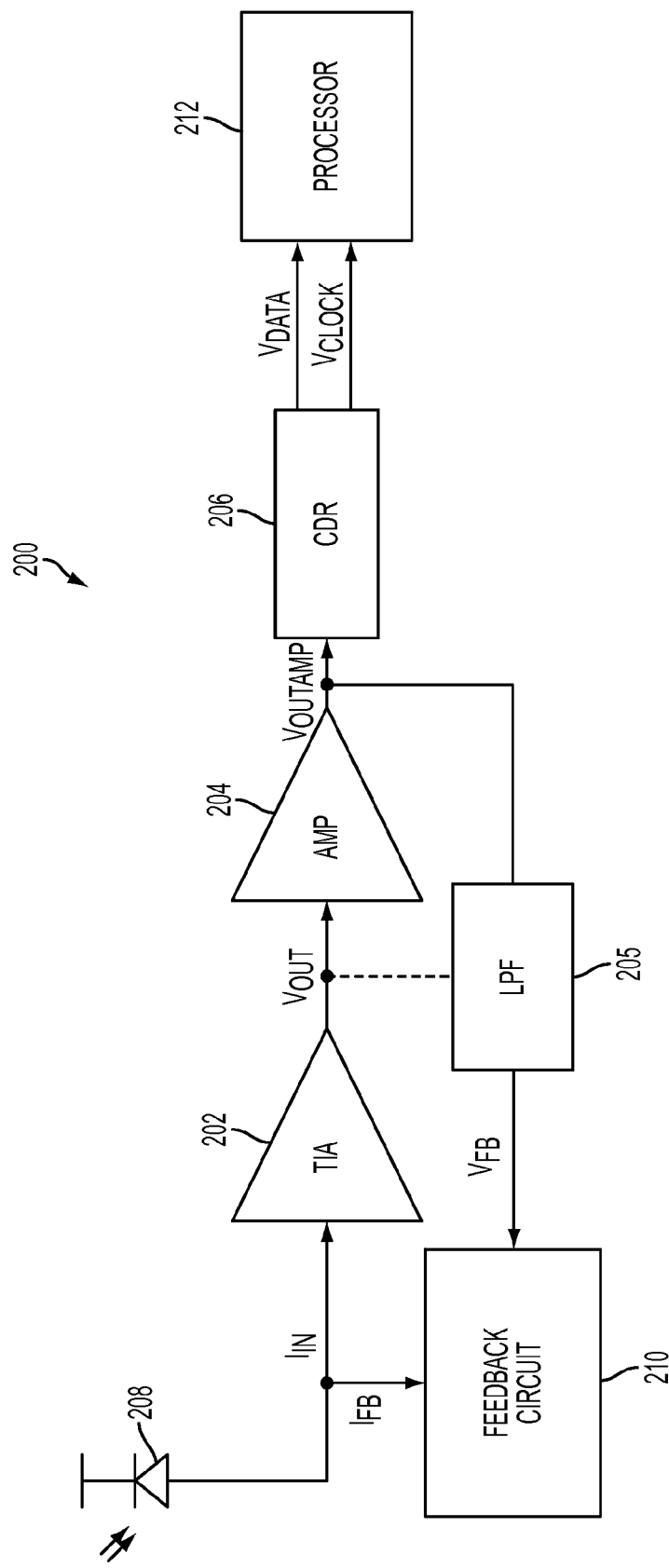
FIG. 2 illustrates a block diagram of an exemplary embodiment of an optical receiver system.

FIG. 2 illustrates a block diagram of an exemplary embodiment of an optical receiver system 200. The system 200 includes a TIA 202, an amplifier 204, that may include an amplifier such as, for example, a limiting amplifier, a clock and data recovery block (CDR) 206, a current output device 208 that may include any type of device that outputs a current such as, for example, a photodiode, and a feedback circuit 210 that receives a feedback voltage ($V_{FB}$) from a low pass filter (LPF) 205. The LPF 205 may be connected to either the output of the amplifier 204 or the output of the TIA 202. The features of the system 200 may be arranged as separate components or with any combination of features arranged as integrated components in an integrated circuit chip. In the illustrated embodiment, the system 200 outputs signals to a processor device or logic circuit 212 that may also be included on in integrated circuit or on a separate circuit or device.

In operation, the current output device 208 outputs a current signal ($I_{IN}$) to the TIA 202 and the feedback circuit 210. The TIA 202 converts $I_{IN}$ into corresponding voltage signal ($V_{out}$) that is output to the amplifier 204. The amplifier 204 amplifies the $V_{out}$ signal and outputs an amplified signal $V_{outAMP}$ to the CDR 206. The $V_{outAMP}$ signal (or in alternate embodiments, the $V_{out}$ signal from the TIA 202) DC content is measured by the LPF 205 and the DC content (signal $V_{FB}$) is sent to the feedback circuit 210. The CDR 206 converts the amplified voltage into a digital data signal and recovers an associated clock signal from the data rate of the digital data. The CDR outputs a data signal $V_{data}$ and a clock signal $V_{clock}$ to the processor 212.

Figure 3:
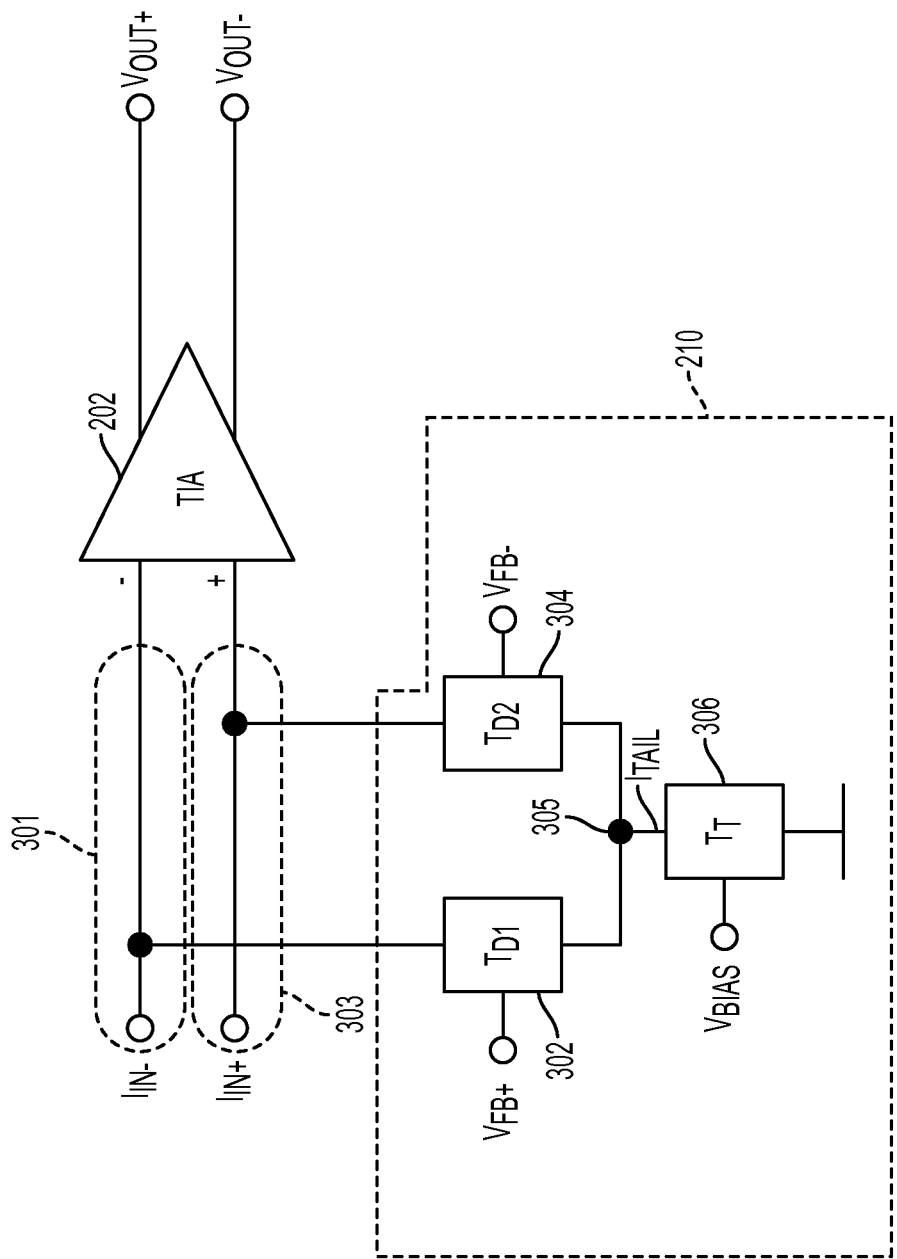
FIG. 3 illustrates a block diagram of an exemplary embodiment of a portion of the system of FIG. 2.

FIG. 3 illustrates a block diagram of an exemplary embodiment of a portion of the system 200. In this regard, the system 200 is implemented as a circuit having $I_{IN-}$ and $I_{IN+}$ inputs. In the illustrated embodiment, the $V_{IN+}$ input may be connected to the current output device 208 (of FIG. 2) and the $I_{IN-}$ input may be floating. The TIA 202 outputs signals $V_{OUT+}$ and $V_{OUT-}$ where the $V_{OUT+}$ signal may be connected to the amplifier 204 (of FIG. 2) and the $V_{OUT-}$ signal may be floating, alternatively both $V_{OUT+}$ and $V_{OUT-}$ may be connected to the amplifier 204 as a differential signal $V_{OUT}$. The feedback circuit 210 in the illustrated embodiment includes a first transistor ($T_{D1}$) 302 that is connected to the $I_{IN-}$ node 301 and a second transistor ($T_{D2}$) 304 that is connected to the $I_{IN+}$ node 303. A third transistor ($T_T$) 306 is biased by a bias voltage ($V_{BIAS}$) (e.g., a bias voltage source such as a constant or relatively constant voltage) and is connected to the $T_{D1}$ 302 and the $T_{D2}$ 304 at a node 305. Transistors $T_{D1}$ 302, $T_{D2}$ 304, and $T_T$ 306 may include any type of transistor, for example, including but not limited to, bipolar transistors and field effect transistors. For the embodiments described herein, though the figures and descriptions include field effect transistors, one of ordinary skill in the art would understand that any of the field effect transistors may be replaced with a variety of other types of transistors, such as, for example, bipolar transistors in alternate embodiments. In this regard, the source, drain, and gate terminals of the field effect transistors described herein correspond to emitter, collector, and base terminals respectively for embodiments that include bipolar transistors and may be used interchangeably when describing the embodiments. The use of the terms source, drain, and gate terminals is thus not limiting to embodiments that include only field effect transistors and may include terminals for any similar corresponding transistor terminals (e.g., emitter, collector, and base terminals respectfully) for other types of transistors understood by one of ordinary skill in the art. In operation, the $V_{BIAS}$ applied to the $T_T$ 306 provides a constant current $I_{TAIL}$. The $I_{TAIL}$ is steered by the input voltages $V_{FB+}$ and $V_{FB-}$ through the transistors $T_{D1}$ 302 and $T_{D2}$ 304 to produce currents $I_{FB+}$ and $I_{FB-}$. The currents $I_{FB+}$ and $I_{FB-}$ subtract from the currents $I_{IN+}$ and $I_{IN-}$ at the nodes 303 and 301 respectively, to remove the DC input current and to provide level restoration. The arrangement may also be used to compensate for DC offsets in the TIA 202 and the amplifier 204.

Figure 4:
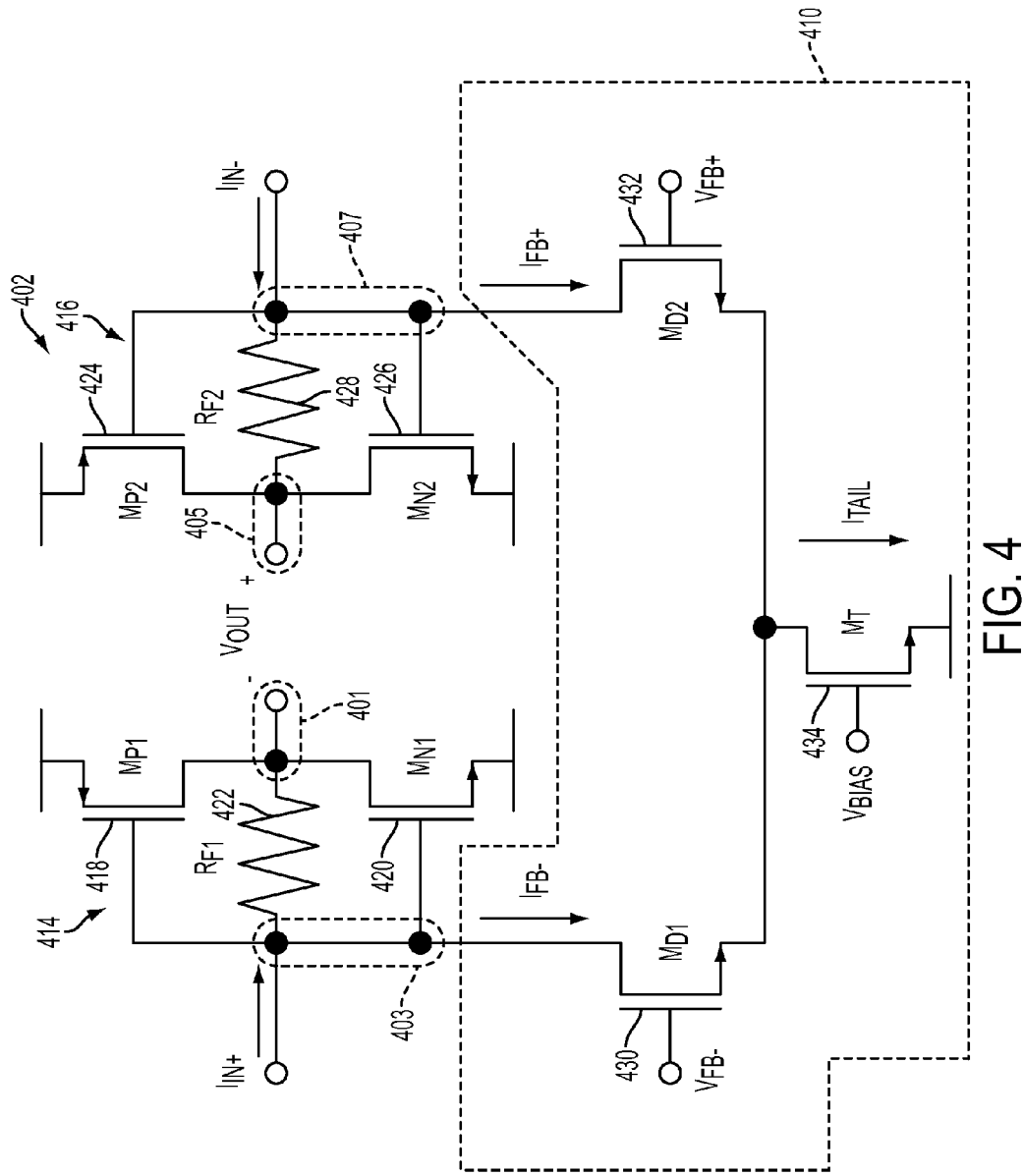
FIG. 4 illustrates a circuit diagram of an exemplary embodiment of a TIA and differential circuit.

FIG. 4 illustrates a circuit diagram of an exemplary embodiment of a TIA 402 and feedback circuit 410 that correspond to the TIA 202 and feedback circuit 210 of the system 200 (of FIG. 2). In this regard, the TIA 402 is a CMOS inverter TIA that include a first single-ended inverter portion 414 and a second single-ended inverter portion 416. The first single-ended inverter portion 414 includes transistors $M_{P1}$ 418 and $M_{N1}$ 420, and a resistor $R_{F1}$ 422. The second single-ended inverter portion 416 includes transistors $M_{P2}$ 424 and $M_{N2}$ 426, and a resistor $R_{F2}$ 428.

The feedback circuit 410 includes differential pair transistors $M_{DT}$ 430 and $M_{D2}$ 432 and a tail transistor $M_T$ 434. The $V_{OUT-}$ node 401 is connected to the resistor $R_{FT}$ 422 and the drain terminals of the $M_{PT}$ 418 and $M_{N1}$ 420. The $I_{IN+}$ node 403 is connected to the gate terminals of the $M_{PT}$ 418 and $M_{N1}$ 420, the $R_{FT}$, and the drain terminal of the $M_{D1}$ 430. The $V_{OUT+}$ node 405 is connected to the resistor $R_{F2}$ 228 and the drain terminals of the $M_{p2}$ 424 and $M_{N2}$ 426. The $I_{IN-}$ node 407 is connected to the gate terminals of the $M_{p2}$ 424 and $M_{N2}$ 426, the $R_{F2}$ 228 and the drain terminal of the $M_{D2}$ 432. The node 409 is connected to the drain terminal of the $M_T$ 434 and the source terminals of the $M_{DT}$ 430 and $M_{D2}$ 432. The $M_T$ 434 receives a bias voltage $V_{BIAS}$ the gate terminal. The node 401 ($V_{OUT}$) outputs $V_{OUT-}$ and may be connected to an amplifier, such as, for example, amplifier 202 (of FIG. 2). A low pass filter LPF, such as, for example the LPF 205 (of FIG. 2) may receive $V_{OUT-}$ prior to, or following amplification (e.g., $V_{outAMP}$ output by the amplifier 204) and is connected to the gate terminal of the MD1 430, which provides $V_{FB-}$ to the $M_{D1}$ 430. The node 405 ($V_{OUT+}$) outputs $V_{OUT+}$ and may be connected to an amplifier, such as, for example, amplifier 202 (of FIG. 2). A low pass filter LPF, such as, for example the LPF 205 (of FIG. 2) may receive $V_{OUT+}$ prior to, or following amplification (e.g., $V_{outAMP}$) and is connected to the gate terminal of the $M_{D2}$ 432, which provides $V_{FB+}$ to the $M_{D2}$ 432. The operation of the illustrated embodiment is similar to the operation described above in FIG. 3.

Figure 5:
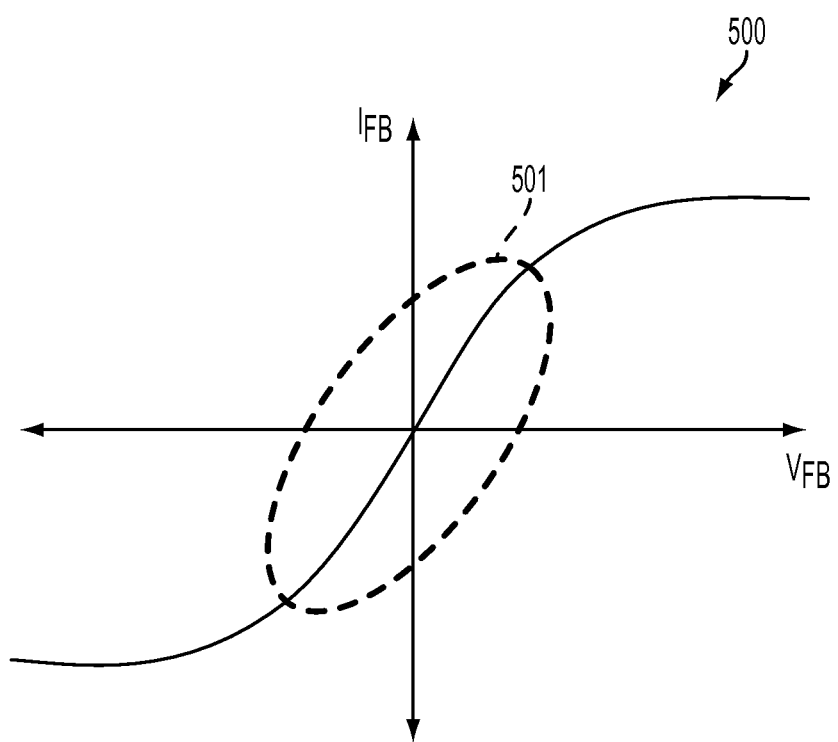
FIG. 5 illustrates a graph of the $V_{FB}$ to $I_{FB}$ characteristic of the circuit illustrated in FIG. 4.

FIG. 5 illustrates a graph 500 of the $V_{FB}$ to $I_{FB}$ characteristic of the circuit illustrated in FIG. 4. In this regard, where $V_{FB}=(V_{FB+}-V_{FB-})$ and $I_{FB}=(V_{FB+}-V_{FB})$ there exists a linear region 501 where the current may be divided between the two sides of the feedback circuit 410 with constant transconductance. The constant transconductance provides a constant gain for the feedback input, which keeps the feedback loop response stable as $I_{FB}$ and $V_{FB}$ vary within the linear region 501. The gain and the linear range of the feedback circuit 410 may be adjusted by changing the $V_{BIAS}$ voltage, which allows compensation for process and environmental variations. The differential current may be positive or negative allowing the feedback circuit 410 to compensate for a negative single-ended DC input current by subtracting more current from the opposite polarity input, thus balancing the subtracted current from both halves of the TIA 402 to output a balanced differential signal.

Figure 6:
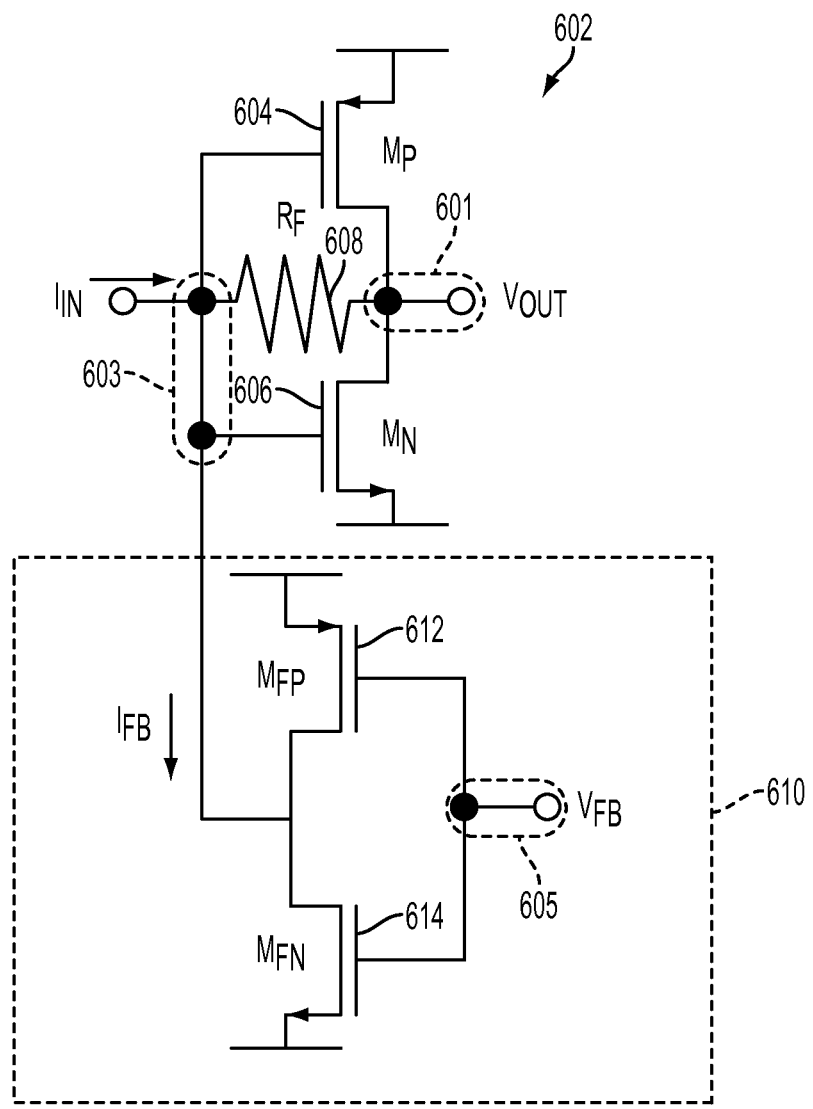
FIG. 6 illustrates an exemplary embodiment of a single-ended TIA with a CMOS inverter and a CMOS inverter transconductor circuit.

FIG. 6 illustrates an exemplary embodiment of a single-ended TIA 602 with a CMOS inverter and a feedback circuit 610. In this regard, the TIA 602 portion includes transistors $M_P$ 604 and $M_N$ 606 and a resistor $R_F$ 608. The feedback circuit 610 includes transistors $M_{FP}$ 612 and $M_{FN}$ 614. In the illustrated embodiment, the node 603 is connected to the $I_{IN}$, the $R_F$ 608; the gate terminals of the $M_P$ 604 and $M_N$ 606; and the drain terminals of the $M_{FP}$ 612 and $M_{FN}$ 614. The node 601 is connected to the $V_{OUT}$; the drain terminals of the $M_P$ 604 and $M_N$ 606 and the $R_F$ 608. The node 605 is connected to the gate terminals of the $M_{FP}$ 612 and $M_{FN}$ 614 and a low pass filter LPF, such as, for example the LPF 205 (of FIG. 2), which may receive $V_{OUT}$ prior to, or following amplification (e.g., $V_{outAMP}$ output from the amplifier 204). The single-ended TIA 602 corresponds to the TIA 202 block (of FIG. 2) while the feedback circuit 610 corresponds to the feedback circuit block 210 and may be incorporated into an alternate embodiment of the system 200 described above.

Figure 7:
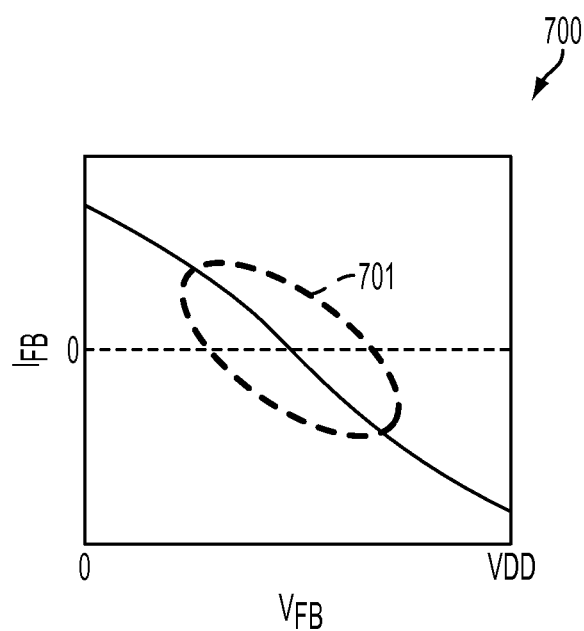
FIG. 7 illustrates a graph of the $V_{FB}$ to $I_{FB}$ characteristic of the illustrated embodiment in FIG. 6.

In operation, the feedback circuit 610 provides feedback input for DC offset cancelation and restoration. In this regard, the input $V_{FB}$ adjusts the current $I_{FB}$ flowing from the node 603. The current $I_{FB}$ subtracts from the current $I_{IN}$ at the node 603 allowing removal of the DC input current and providing level restoration. FIG. 7 illustrates a graph 700 of the $I_{FB}$ to $V_{FB}$ of the illustrated embodiment in FIG. 6. The linear region 701 illustrates the linear region where current $I_{FB}$ may take on positive or negative values with constant transconductance. The constant transconductance provides a constant gain for the feedback input, which keeps the feedback loop response stable as $I_{FB}$ and $V_{FB}$ vary within the linear region 701.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A circuit comprising:
   a transimpedance amplifier portion having a first input node and a second input node; and
   a feedback circuit portion comprising:
      a first transistor having a drain terminal connected to the first input node, a source terminal, and a gate terminal;
      a second transistor having a drain terminal connected to the second input node, a source terminal, and a gate terminal; and
      a third transistor having a drain terminal connected to the source terminal of the first transistor and the source terminal of the second transistor.

2. The circuit of claim 1, wherein the third transistor comprises a gate terminal connected to a bias voltage source.

3. The circuit of claim 1, wherein the transimpedance amplifier portion comprises a first output node and a second output node.

4. The circuit of claim 3, wherein the first output node is communicatively coupled to a gate terminal of the first transistor via a low pass filter.

5. The circuit of claim 4, wherein the second output node is coupled to a gate terminal of the second transistor via the low pass filter.

6. The circuit of claim 1, wherein the circuit comprises a current output device connected to the first input node.

7. The circuit of claim 6, wherein the current output device is a photodiode.

8. The circuit of claim 4, wherein the transimpedance amplifier portion comprises a first single-ended inverter portion and a second single-ended inverter portion.

9. The circuit of claim 3, wherein the transimpedance amplifier portion comprises a first single-ended inverter portion that comprises:
   a fourth transistor having a gate terminal connected to the first input node and a drain terminal connected to the first output node;
   a fifth transistor having a gate terminal connected to the first input node and a drain terminal connected to the first output node;
   a first resistor connected to the first input node and the first output node.

10. The circuit of claim 9, wherein the transimpedance amplifier portion comprises a second single-ended inverter portion that comprises:

a sixth transistor having a gate terminal connected to the second input node and a drain terminal connected to the second output node;

a seventh transistor having a gate terminal connected to the second input node and a drain terminal connected to the second output node;

a second resistor connected to the second input node and the second output node.

11. A circuit comprising:

a transimpedance amplifier portion having an input node and an output node; and a feedback circuit portion comprising:

a first transistor having a drain terminal connected to the input node, a source terminal, and a gate terminal connected to the output node via a low pass filter; and a second transistor having a drain terminal connected to the first input node, a source terminal, and a gate terminal connected to the output node via the low pass filter, wherein the gate terminal of the first transistor and the gate terminal of the second transistor are connected to the output node with a resistor-capacitor feedback portion of the low pass filter and wherein the transimpedance amplifier portion comprises a single-ended inverter portion.

12. The circuit of claim 11, wherein the single-ended inverter portion comprises:

a third transistor having a drain terminal connected to the output node and a gate terminal connected to the input node;

a fourth transistor having a drain terminal connected to the output node and a gate terminal connected to the input node; and a resistor having a terminal connected to the input node and a terminal connected to the output node.

13. The circuit of claim 11, wherein the circuit comprises a current output device connected to the input node.

14. The circuit of claim 13, wherein the current output device is a photodiode.

15. A system comprising:

a transimpedance amplifier portion having a first input node, a second input node, a first output node, and a second output node;

a feedback circuit portion comprising:

a first transistor having a drain terminal connected to the first input node, a source terminal, and a gate terminal;

a second transistor having a drain terminal connected to the second input node, a source terminal, and a gate terminal; and a third transistor having a drain terminal connected to the source terminal of the first transistor and the source terminal of the second transistor; and an amplifier portion having a first input node connected to the first output node of the transimpedance amplifier portion, a second input node connected to the second output node of the transimpedance amplifier portion, and an output node.

16. The system of claim 15, further comprising a clock and data recovery portion having an input node connected to the output node of the amplifier portion, a data signal output node and a clock signal output node.

17. The system of claim 16, further comprising a processor portion having a first input node connected to the data signal output node and a second input node connected to the clock signal output node.

18. The system of claim 15, wherein the system further comprises a current output device connected to the first input node.

19. The system of claim 18, wherein the current output device is a photodiode.

20. A system comprising:

a transimpedance amplifier portion having an input node and an output node;

a feedback circuit portion comprising:

a first transistor having a drain terminal connected to the input node, a source terminal, and a gate terminal connected to the output node; and a second transistor having a drain terminal connected to the input node, a source terminal, and a gate terminal connected to the output node; and an amplifier portion having an input node connected to the output node of the transimpedance amplifier portion, and an output node.

21. The system of claim 20, further comprising a clock and data recovery portion having an input node connected to the output node of the amplifier portion, a data signal output node and a clock signal output node.

22. The system of claim 21, further comprising a processor portion having a first input node connected to the data signal output node and a second input node connected to the clock signal output node.

23. The system of claim 20, wherein the system further comprises a current output device connected to the input node of the transimpedance amplifier portion.

* * * * *